(12) United States Patent
Schreck et al.

(10) Patent No.: US 7,396,408 B2
(45) Date of Patent: Jul. 8, 2008

(54) MONOCRYSTALLINE DIAMOND LAYER AND METHOD FOR THE PRODUCTION THEREOF

(75) Inventors: Matthias Schreck, Augsburg (DE); Stefan Gsell, Augsburg (DE); Bernd Stritzker, Kissing (DE)

(73) Assignee: Universität Augsburg, Augsburg (DE)

( * ) Notice: Subject to any disclaimer, the term of this patent is extended or adjusted under 35 U.S.C. 154(b) by 0 days.

(21) Appl. No.: 10/555,330

(22) PCT Filed: May 3, 2004

(86) PCT No.: PCT/EP2004/004678

§ 371 (c)(1),
(2), (4) Date: Dec. 14, 2006

(87) PCT Pub. No.: WO2004/100238

PCT Pub. Date: Nov. 18, 2004

(65) Prior Publication Data

US 2007/0084398 A1    Apr. 19, 2007

(30) Foreign Application Priority Data

May 6, 2003   (DE) ................................ 103 20 133

(51) Int. Cl.
*C30B 25/12*   (2006.01)
*C30B 25/14*   (2006.01)

(52) U.S. Cl. .......................................... 117/68; 117/75
(58) Field of Classification Search .................... 117/68, 117/75

See application file for complete search history.

(56) References Cited

U.S. PATENT DOCUMENTS

| 4,902,535 A | 2/1990 | Garg et al. |
| 5,009,966 A | 4/1991 | Garg et al. |
| 5,268,217 A | 12/1993 | Kimock et al. |
| 5,506,038 A | 4/1996 | Knapp et al. |
| 5,508,092 A | 4/1996 | Kimock et al. |
| 5,527,596 A | 6/1996 | Kimock et al. |
| 5,538,911 A | 7/1996 | Yamazaki |
| 5,635,245 A | 6/1997 | Kimock et al. |

(Continued)

FOREIGN PATENT DOCUMENTS

| WO | WO9403331 A | * | 2/1994 |
| WO | WO02082515 A | * | 10/2002 |

OTHER PUBLICATIONS

Hayashi et al., "The formation of a (111) texture of the diamond film on Pt/TiO2/SiOx/Si substrate by microwave plasma chemical vapor deposition", Elsevier Science B.V. 2002, Diamond and Related Materials 11, pp. 499-503.

Schreck et al., "Diamond/Ir/SrTiO3: A material combination for improved heteroepitaxial diamond films", American Institute of Physics, 1999, Applied Science Letters, vol. 74, No. 5, pp. 650-652.

PCT International Search Report for PCT/EP2004/004678 completed by the EP Searching Authority on Jul. 29, 2004.

*Primary Examiner*—Felisa Hiteshew
(74) *Attorney, Agent, or Firm*—Barnes & Thornburg LLP

(57) ABSTRACT

This invention relates to a method for the production of diamond films with low misorientation through the deposition of diamond on a film system, whereby the film system exhibits a substrate film made of monocrystalline silicon or silicon carbide, at least one buffer film arranged on that, and at least one metal film made of a refractory metal arranged on that, whereby the diamond is deposited on the at least one metal film.

19 Claims, 16 Drawing Sheets

U.S. PATENT DOCUMENTS

| | | |
|---|---|---|
| 5,637,353 A | 6/1997 | Kimock et al. |
| 5,643,423 A | 7/1997 | Kimock et al. |
| 5,688,557 A | 11/1997 | Lemelson et al. |
| 5,814,149 A | 9/1998 | Shintani et al. |
| 5,844,225 A | 12/1998 | Kimock et al. |
| 5,863,324 A | 1/1999 | Kobashi et al. |
| 5,882,786 A * | 3/1999 | Nassau et al. ............... 428/336 |
| 6,165,616 A | 12/2000 | Lemelson et al. |
| 6,270,898 B1 * | 8/2001 | Yamamoto et al. .......... 428/408 |
| 6,383,288 B1 | 5/2002 | Hayashi et al. |
| 2001/0031346 A1 | 10/2001 | Iwamura |
| 2002/0003239 A1 | 1/2002 | Ramdani et al. |

* cited by examiner

MONOCRYSTALLINE DIAMOND LAYER AND METHOD FOR THE PRODUCTION THEREOF

CROSS REFERENCE TO RELATED APPLICATIONS

This application is a U.S. national counterpart application, filed under 35 U.S. C. 371, of international application serial No. PCT/EP2004/004678 filed May 3, 2004, which claims priority to German patent application 103 20 133.5, filed May 6, 2003.

The present invention pertains to a monocrystalline or quasi monocrystalline diamond film, i.e., a diamond film with little misorientation, and a method for its production. Such diamond films are needed in particular as components in mechanics, micromechanics, electronics, e.g., as a growth substrate for the epitaxial deposition of semiconductor materials for semiconductor elements, e.g., made of GaN, GaAs or AlN, in optics or even in surgery, e.g., for diamond scalpels. In the field of microelectronics in particular, a diamond film with little misorientation (also called a quasi monocrystalline or else a monocrystalline diamond film in the following) is well-suited as a growth substrate for semiconductors, since an epitaxial growth of the semiconductor is possible on this kind of monocrystalline diamond films. In particular, the extremely high thermal conductivity of diamond is especially effective when used as the epitaxial growth substrate for high-power semiconductor elements such as GaN laser diodes. The production of a monocrystalline film from cubic boron nitride (c-BN) is also possible on such a growth substrate.

The state of the art for the production of such quasi monocrystalline diamond films, in which the initial grain boundaries have dissolved into short defect bands, is to deposit an epitaxial monocrystalline or quasi monocrystalline iridium film on an oxidic monocrystal, for example, strontium titanate ($SrTiO_3$) (STO), by means of electron beam vaporization. Iridium films having a thickness of approximately 150 nm are well-suited for this purpose. This state of the art is shown in FIG. 2A.

Through brief application of a bias voltage in a plasma reactor, it is now possible to create on the iridium film epitaxial diamond crystals that subsequently grow into a cohesive film. Under suitable process conditions, the texture continuously improves with increasing film thickness until a quasi monocrystalline diamond film results. This has been described, for example, in Schreck et al. "Diamond/Ir/SrTiO$_3$: A Material Combination for Improved Heteroepitaxial Diamond Films", Applied Physics Letters, Volume 74, pages 650-652 (1999).

Instead of the strontium titanate monocrystals as the substrate, it is also possible to use other oxidic monocrystals such as MgO or $Al_2O_3$. What is disadvantageous about this system, however, is that the substrate and the diamond film have different thermal properties, so that thermal stresses of more than 5 GPa result during the cooling from the deposition temperature. While very thin diamond films having a thickness <1 µm adhere despite that, technically relevant diamond films having a thickness above 1 µm almost always flake off the substrate. As a result, the specimen may not be exposed to any change of temperature during the long period of growth, often lasting more than 100 hours, which means that the specimen may not be taken from the growth chamber during the entire growth period in order to check the progress of the growth.

Another major disadvantage of this state of the art is that the monocrystalline substrates such as strontium titanate can indeed be obtained in sizes up to 2" in diameter. However, the prices of these substrates are exorbitantly high. Less expensive oxide crystals, such as sapphire, exhibit the thermal stress problem. What is critical for success and the prevailing of quasi monocrystalline diamond films in the marketplace, however, is that large-area quasi monocrystalline diamond films with adequate thickness are available inexpensively. In addition, for a number of applications it is desirable that the diamond film remain adhered to the growth substrate permanently.

The task of the present invention is thus to make available diamond films, and a method for their production, that can be produced in adequate thicknesses reliably, verifiably and inexpensively. This task is carried out by means of the method according to claim 1, and by means of the diamond film according to claim 11. Advantageous further developments of the method according to the inventive method and the inventive diamond film are given in the particular dependent claims.

According to the invention, monocrystalline silicon or a sequence of films made, for example, of sintered silicon carbide and monocrystalline silicon in (100) or (111) orientation is now suggested, whereby at least one buffer film is deposited onto this substrate. Epitaxially deposited onto this buffer film is a metal film, in particular, made of iridium and/or platinum and/or rhenium and/or ruthenium, as well as a sequence of multiple metal films such as platinum on iridium, for example. Oxidic films are especially well-suited as buffer films, but so are carbides such as silicon carbide.

The substrates, silicon or sintered silicon carbide, are available with large areas and, in particular, possess a good thermal fit with diamond. A thin monocrystalline silicon film can then be bonded onto a thin monocrystalline silicon film. As a result, the thermal stress during the cooling of an applied diamond film can be minimized, and the adhesion optimized. These substrates are inexpensive and available with large areas. The deposition of the buffer film, primarily oxides such as, for example, strontium titanate, yttrium-stabilized zirconium oxide, cerium oxide or even silicon carbide, can take place by means of vacuum methods, MBE, PLD, CVD or PVD, for example. Oxides such as those mentioned above allow good adhesion of metal films deposited onto them, particularly iridium films. It is therefore possible to deposit quasi monocrystalline iridium films onto these buffer films by means of electron beam vaporization or sputtering, for example.

In this regard, the buffer films advantageously exhibit a thickness of 1 to 200 nm, preferably from 10 to 120 nm, advantageously from 15 to 100 nm. The metal film advantageously possesses a thickness of 10 to 300 nm, advantageously from 100 to 200 nm, advantageously 150 nm.

Interestingly, it turned out in this regard that the metal films can be far better oriented than the buffer films that lie underneath them. That is because the buffer films can typically exhibit large misorientations of >2°, >1° or even >0.5°, while the iridium films applied to them are high-quality and monocrystalline or quasi monocrystalline, e.g., with a misorientation of <0.5° or <0.2°.

Thus, an ideal substrate is available for the subsequent deposition of monocrystalline or quasi monocrystalline diamond films onto the metal film. The deposition of the diamond can take place by means of microwave CVD, for example, or other conventional methods. The epitaxial nucleation of the diamond can take place by means of the so-called BEN method (bias enhanced nucleation) or by means of the Shintani process (SU 5,814,149).

What is advantageous about the suggested method is that the substrate is highly scaleable and inexpensive. In addition, the created quasi monocrystalline iridium films and the created diamond films adhere to this substrate outstandingly well because of the good thermal match between diamond and silicon. One important aspect of the present invention consists in the fact that, particularly with suitable process management, i.e., slow deposition of the metal film on the buffer film, the metal film can be far better oriented than the buffer film lying under it. Such buffer films, particularly TiN, $CeO_2$, YSZ (yttrium-stabilized zirconium oxide), $Y_2O_3$, MgO, strontium titanate ($SrTiO_3$), etc., as they are known for the deposition of high-temperature superconductor films on silicon, typically possess still-large misorientations of >1°, but can now be used as a base for the growth of quasi monocrystalline or monocrystalline metal films despite that.

If silicon carbide is used as the substrate, then a silicon carbide sintered body can be used onto which a thin silicon monocrystalline film can be applied as an additional intermediate film. Both the sintered body and the silicon monocrystalline film possess the advantage of a similarly good thermal match to diamond as a silicon monocrystal, but also possess the advantage that the intermediate silicon film as buffer film can also be removed, and thus free-standing, thick diamond wafers can be created. The silicon carbide sintered body can then be reused as a substrate. Such sintered bodies made of SiC are available with large areas and inexpensively.

What is critical about the present invention is thus the fact that metal films can be created that possess an polar and azimuthal misorientation distribution with a width of <0.2°. In such a case, the inventive quasi monocrystalline diamond films can then be created on this metal film. The present patent application therefore also relates to a substrate for the creation of quasi monocrystalline films having a structure consisting of substrate, buffer film and metal film as described above, whereby the polar and azimuthal misorientation distribution of the metal film exhibits width of <0.2°.

In this regard, it is not only cubic materials that are suitable as buffer films, but so also are all materials that exhibit a square or rectangular surface elementary cell, including sapphire, for example.

Several examples of inventive methods and inventive diamond films will now be described below. The following are shown:

FIG. 1 a device for creating the inventive diamond films;

FIG. 2 film systems on which diamond films can be deposited;

FIG. 3 the creation of an inventive diamond film;

FIG. 4 alternatives for the substrate for creating an inventive diamond film;

FIG. 5 through FIG. 16 experimental results on inventive diamond films.

FIG. 1 shows a coating facility 10 having a vacuum chamber 11 in which a component (substrate with diamond film) 1 that is to be produced is arranged on a holder 14. Located above the substrate 1 is a ring-shaped bias electrode 15 that is connected to a bias voltage source 16. The figure shows two alternative versions in which either the bias electrode 15 is at a positive potential versus the grounded specimen holder 14, or else the bias electrode 15 is grounded and the specimen holder 14 is at a negative potential. Inside this bias electrode 15, a plasma 13 is created by injecting microwaves from a magnetron 18. The bias voltage that is typically −100 V to −300 V is applied between the bias electrode 15 and the substrate, whereby the specimen is at a negative potential relative to the bias electrode 15. In this way, positive ions are accelerated from the plasma onto the metal surface and oriented nuclei are created. The coating process that is taking place inside the chamber 11 can be observed by means of inspection windows 21*a*, 21*b* that are placed in the walls of the vacuum chamber 11. The vacuum chamber additionally exhibits a magnetron and a gas supply 17 for the reactive gases. The vacuum chamber 11 is evacuated via a line 12.

The supply line to a thermoelement for monitoring the temperature of the holder 14 is designated by reference symbol 19, and supply lines to an induction heating element inside the holder 14 by means of which the holder 14 can be heated and the substrate temperature regulated, is designated by 20*a*, 20*b*.

FIG. 2 now shows various bases for the growth of diamond films.

FIG. 2A shows the state of the art in this regard, in which an iridium film 4 with a thickness of 150 nm is grown on a very expensive strontium titanate monocrystal 2. It is now possible to deposit on this iridium film a diamond film which, however, flakes off easily due to the lack of thermal matches between the substrate, strontium titanate 2, and the diamond film.

FIGS. 2B through 2E show inventive bases for the inventive diamond films. In FIG. 2B, a silicon monocrystal 2 is being provided with a buffer film 3 made of strontium titanate. In this way, an iridium film 150 nm thick is grown, whereby the iridium film exhibits a far smaller misorientation than the strontium titanate 3. In FIG. 2C, yttrium-stabilized zirconium oxide with a thickness of 20 nm is used as the buffer film. In FIG. 2D, two buffer films 3*a*, 3*b* made of yttrium-stabilized zirconium oxide 3*a* with a thickness of 1.5 nm and cerium oxide 3*b* with a thickness of 50 nm are provided. Provided in FIG. 2E are three buffer films, namely a film made of yttrium-stabilized zirconium oxide 3*a* with a thickness of 1.5 nm, a film 3*b* made of cerium oxide with a thickness of 50 nm, and a film 3*c* made of strontium titanate with a thickness of 50 nm.

What all of these inventive film systems have in common is that because of the silicon monocrystal that is being used as the substrate, the thermal match between the base (silicon substrate) and the diamond film deposited on the iridium film is outstanding, so that flaking can be prevented.

FIG. 3 shows a method for creating an inventive diamond film. To do this, in FIG. 3A a buffer film 3, for example, oxides such as strontium titanate SrTiO$_3$, yttrium-stabilized zirconium oxide (YSZ), barium titanate (BaTiO$_3$), yttrium oxide Y$_2$O$_3$, magnesium oxide MgO, titanium oxide TiO$_2$, aluminum oxide Al$_2$O$_3$, are deposited on a silicon monocrystal with 001 or 111 orientation by means of laser ablation, sputtering, MBE or CVD. In FIG. 3B a monocrystalline iridium film 4 is deposited onto this buffer film 3 by means of PVD, MBE, laser ablation or sputtering. Platinum or a film sequence of platinum and iridium can also be used in place of iridium for the growth of a 111-oriented film. Rhenium and ruthenium are also possible alternatives.

Shown in FIG. 3C is the way in which diamond nuclei 5 are deposited on the monocrystalline iridium or platinum film in the CVD process using bias nucleation, or by means of the Shintani process (U.S. Pat. No. 5,814,149) in the case of platinum. In FIG. 3D, it can be seen how with additional growth on the iridium film the nuclei grow into a low-defect quasi monocrystalline diamond film 5.

FIG. 4 shows that the iridium film 4 can be created quasi monocrystalline and with low misorientation, even if the buffer film 3 exhibits a high misorientation. In that regard, in FIG. 4A the system consisting of buffer film 3 and iridium film 4 is deposited on a 001-oriented silicon monocrystal 2.

In FIG. 4D, used as the base for the buffer film 3 and the iridium film 4 is a silicon carbide (SiC) sintered ceramic 2a on which a silicon monocrystalline film 2b is bonded. To obtain a free-standing diamond film, the film 2b can now be used as a sacrificial film, and can be removed after the growth of the diamond film.

Measurements on film sequences such as those that will be shown below document the fact that the iridium is much better oriented than the buffer film underneath it. Such film sequences are thus ideal growth substrates for monocrystalline or quasi monocrystalline diamond growth.

FIG. 5 shows a comparison of the textures of iridium films that are grown on SrTiO$_3$/Si (001) at 650° C. In that regard, FIG. 5A shows that under normal standard growth conditions (growth rate 0.05 nm/s), in essence an iridium film having a 111 texture grows, but this is not what is wanted. Under optimized deposition conditions (growth rate 0.002 nm/s for the first 15 nm, then 0.05 nm/s), however, what grows on the strontium titanate film is an iridium film with a 001 texture that is nearly free of 111-texture components (FIG. 5B).

Here and in the following, all x-ray diffraction measurements with the exception of the pole figures are made with a Seifert 3003PTS HRXRD x-ray diffractometer with TS goniometer.

The measurement of the pole figures took place with a Siemens D5000 diffractometer with a copper tube with point focus and equipped with an open Euler's balance. The measurement range in FIG. 5 was 40°-48° in 2 theta, 0° polar angle.

EXAMPLE 1

In a first example (FIGS. 6 through 8), a 100 nm thick epitaxial strontium titanate (001) film with tilt and twist values of approximately 0.6° and 1.3° respectively was deposited on a silicon substrate. An iridium film with a thickness of 150 nm was deposited onto this by means of electron beam vaporization in a high vacuum at a deposition temperature of 650° C. The growth rates were 0.002 nm/s for the first 15 nm, and then 0.05 nm/s to a film thickness of 150 nm.

FIG. 6 shows the x-ray data for the iridium film, whereby it can be seen that the half-width value of the misorientation distribution is much smaller for the iridium film than for the strontium titanate film.

In this regard, FIG. 6A shows the rocking curves of the SrTiO$_3$ (002) reflex at 2 theta=46.47° and the Ir (002) reflex at 2 theta=47.32°. The measurement curves were normalized to the same level. FIG. 6B shows the azimuthal scan of the SrTiO$_3$ (101) reflex at 2 theta=32.40° and a polar angle chi=45°, and the azimuthal scan of the Ir (311) reflex at 2 theta=83.44° and a polar angle chi=72.45°.

Deposition of diamond on the iridium film then took place by means of microwave CVD. A DC voltage between −250 and −300 V was used in the nucleation step. For the deposition of diamond, a mixture of 7% methane in hydrogen at a total flow of 200 sccm and a pressure of 30 mbar was used in the gas phase. The substrate temperature was 740° C., the microwave power was 1100 W. The nucleation step lasted 60 minutes.

In the subsequent growth step, microwave power of 1100 W, a substrate temperature of 720° C., a gas mixture of 1% methane in hydrogen at a total flow of 200 sccm and 30 mbar pressure was used for 60 minutes. No bias voltage was applied.

A tilt and twist of 1.3° and 1.7° was subsequently measured for the diamond film.

FIG. 7 now shows a raster electron microscope photograph of a diamond film that was deposited onto an Ir/SrTiO$_3$/Si (001) base. The oriented diamond crystallite with a density by surface of approximately 10$^9$ cm$^{-2}$ can be seen. The top area of the truncated pyramid-like crystalline corresponds to a (001) facet, while the side areas are (111) facets. Almost all of the crystals are aligned parallel to each other.

FIG. 8 shows the diamond (111) x-ray pole figure in the measurement range chi=0° ... 85° and phi=0° ... 360° for the film from FIG. 7, 2 theta=43.93°. The epitaxial alignment of the (001) oriented diamond crystalline can be seen.

EXAMPLE 2

In another example (FIGS. 9 and 10), silicon was again used as the substrate and a 20 nm thick epitaxial strontium titanate (001) film with tilt and twist values of approximately 0.4° and 1.4° respectively was deposited on it. An iridium film as in Example 1 was applied to this strontium titanate buffer film. FIG. 9A shows the rocking curves of the SrTiO$_3$ (002) reflex at 2 theta=46.470 and the Ir (002) reflex at 2 theta=47.32°. The measurement curves were normalized to the same level. FIG. 9B shows the azimuthal scan of the SrTiO$_3$ (101) reflex at 2 theta=32.40° and a polar angle chi=45°, and the azimuthal scan of the Ir (311) reflex at 2 theta=83.44° and a polar angle chi=72.45°. It can be seen that the misorientation distribution of the iridium film is substantially lower than that of the strontium titanate film.

As in Example 1, a diamond film was deposited onto this iridium film, whereby the growth step lasted only 30 minutes, however.

EXAMPLE 3

In another example (FIG. 12), a 20 nm thick epitaxial yttrium stabilized zirconium oxide (YSZ) film was deposited on a silicon (001) substrate by means of pulsed laser ablation from a sintered YSZ target in an oxygen atmosphere of $10^{-4}$ mbar at a substrate temperature of 770° C. A krypton fluoride excimer laser at 8 Hz with a pulse duration of 30 ns was used for the laser ablation. This resulted in a growth rate of 0.005 nm per pulse. The orientation of the YSZ film in the x-ray diffraction measurements yielded a tilt of 1.4° and a twist of 1.2°.

An iridium film was applied to this YSZ film by means of an electron beam vaporizer in a high vacuum. This film was applied as in Example 1.

Figure 1:
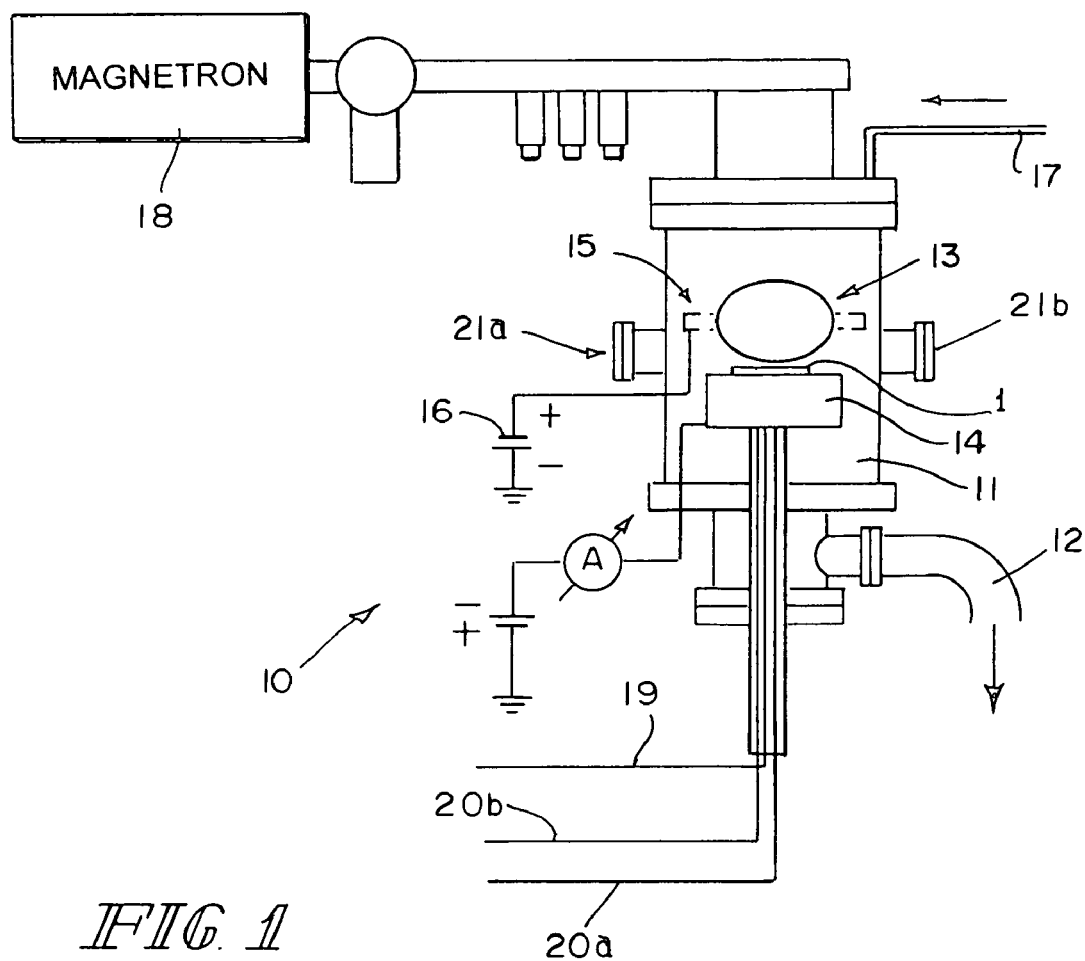
Figure 2A:
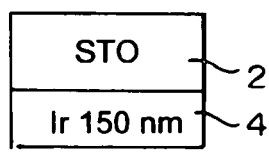
Figure 2B:
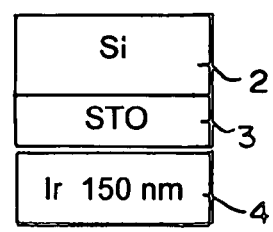
Figure 2C:
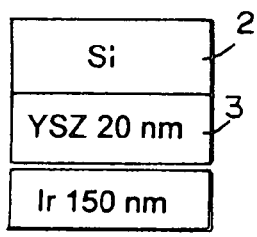
Figure 2D:
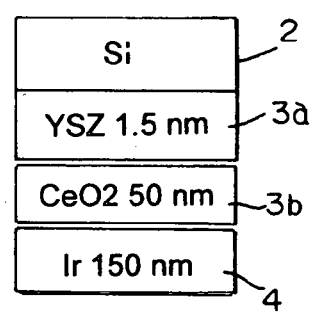
Figure 2E:
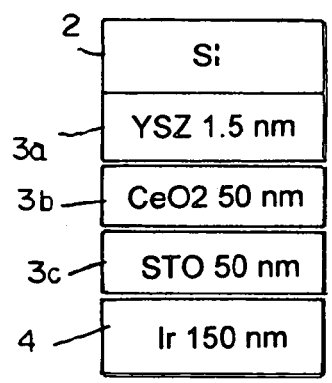
Figure 3A:
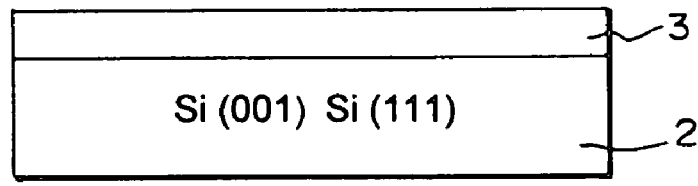
Figure 3B:
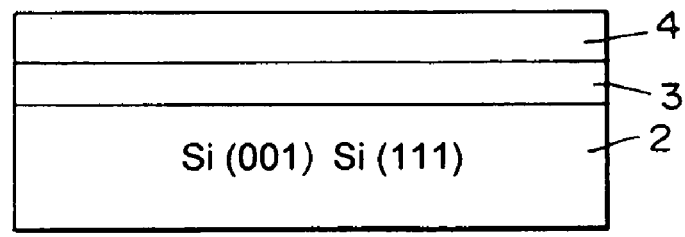
Figure 3C:
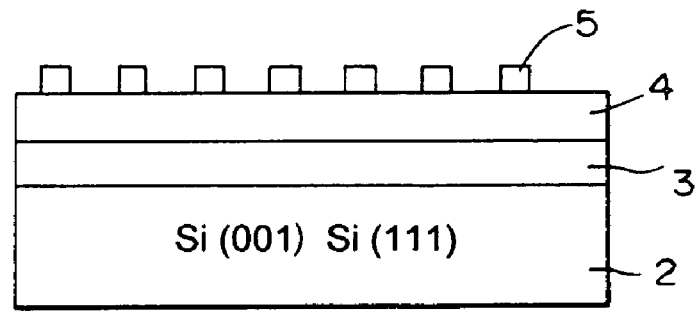
Figure 3D:
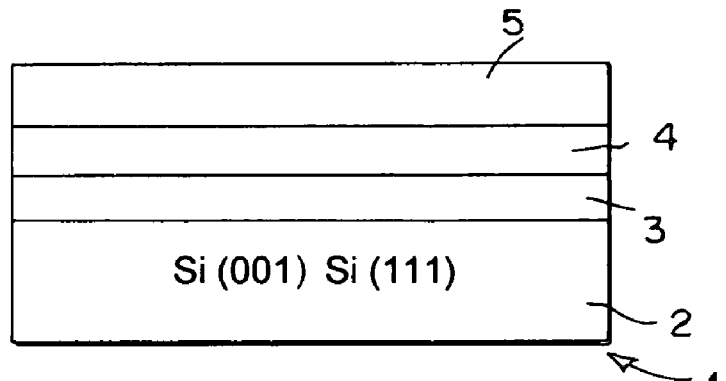
Figure 4A:
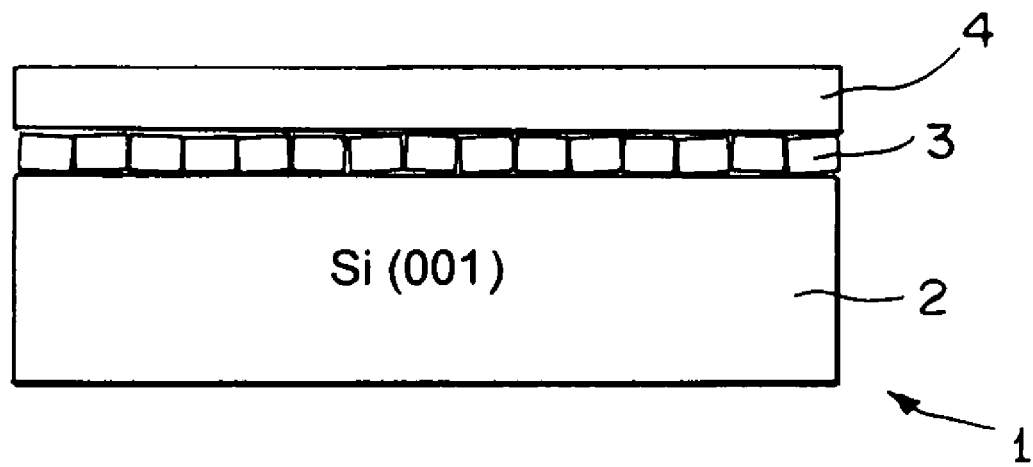
Figure 4B:
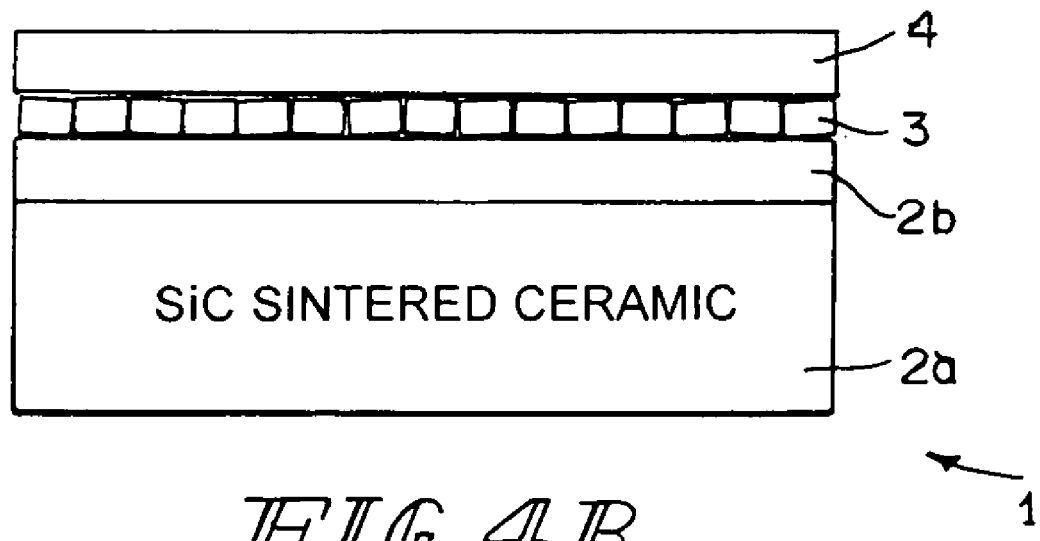
Figure 5A:
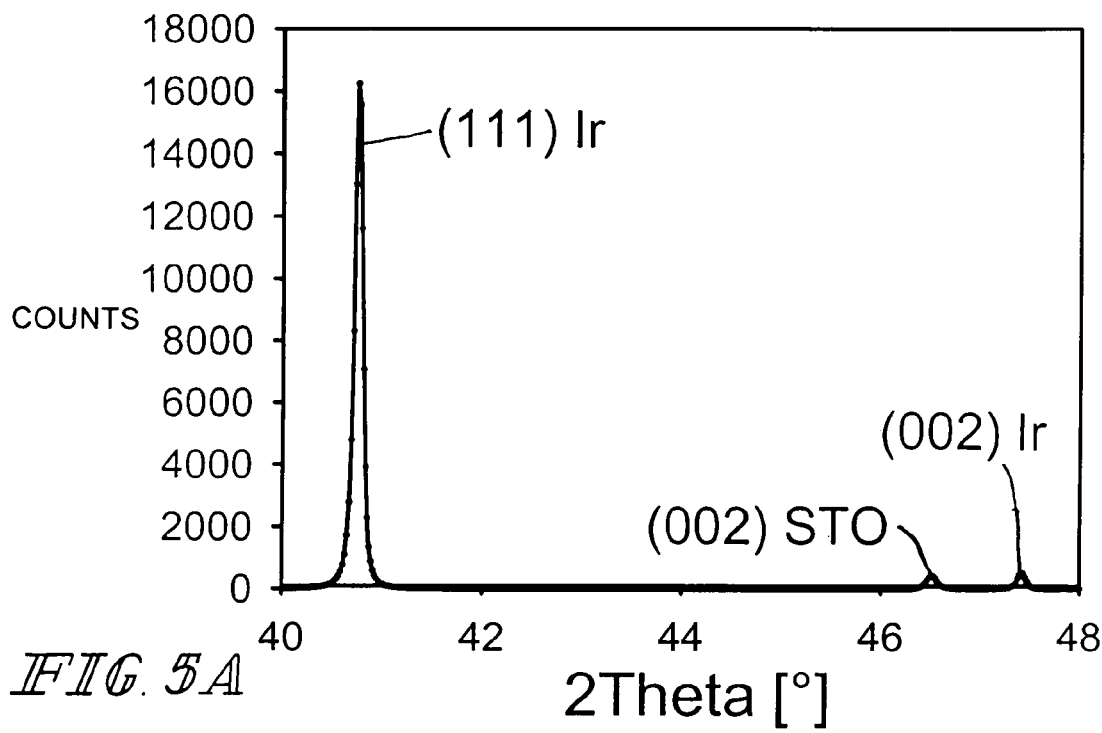
Figure 5B:
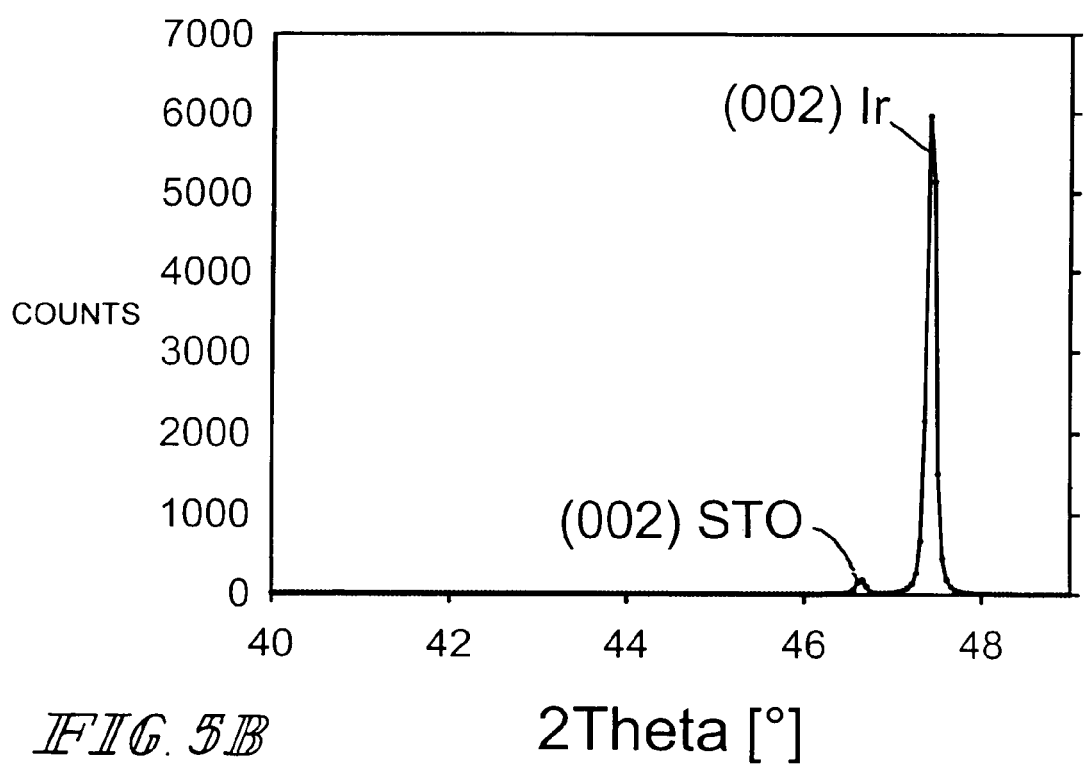
Figure 6A:
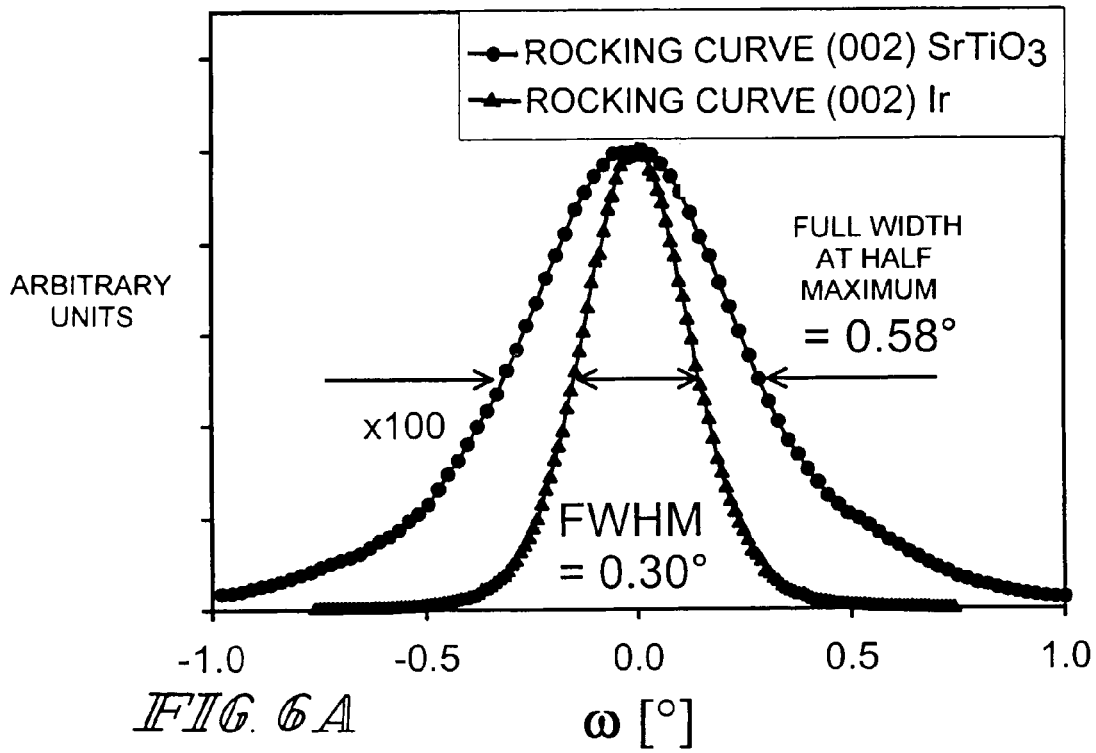
Figure 6B:
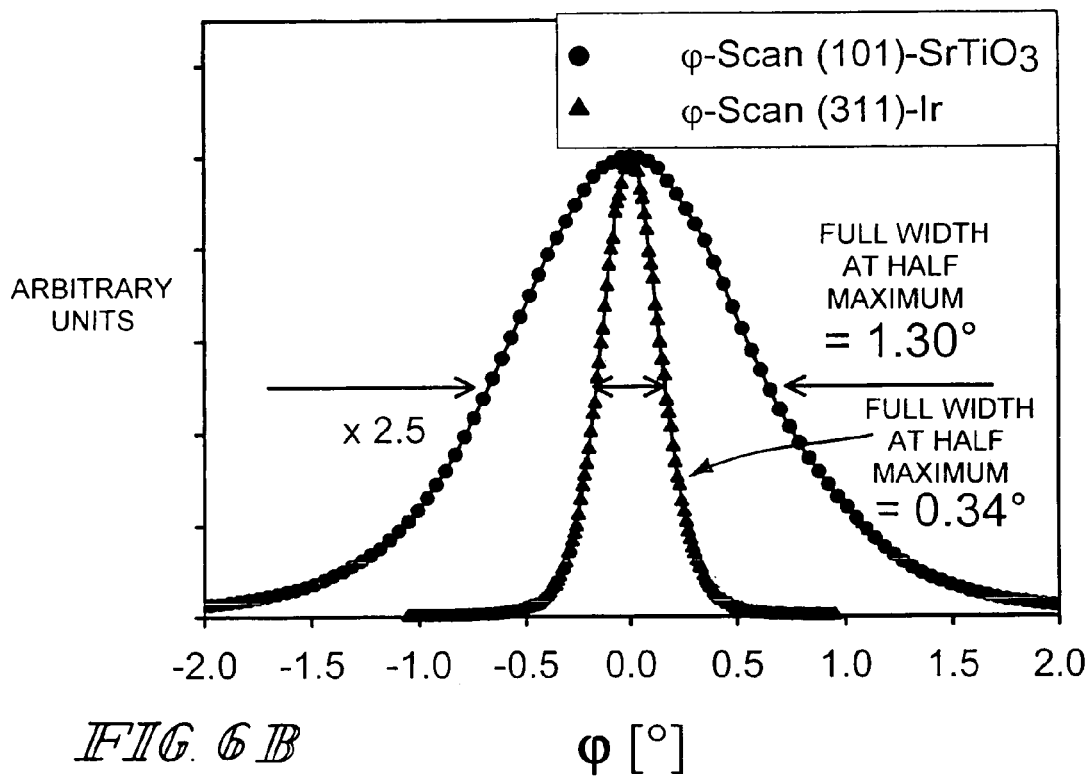
Figure 7:
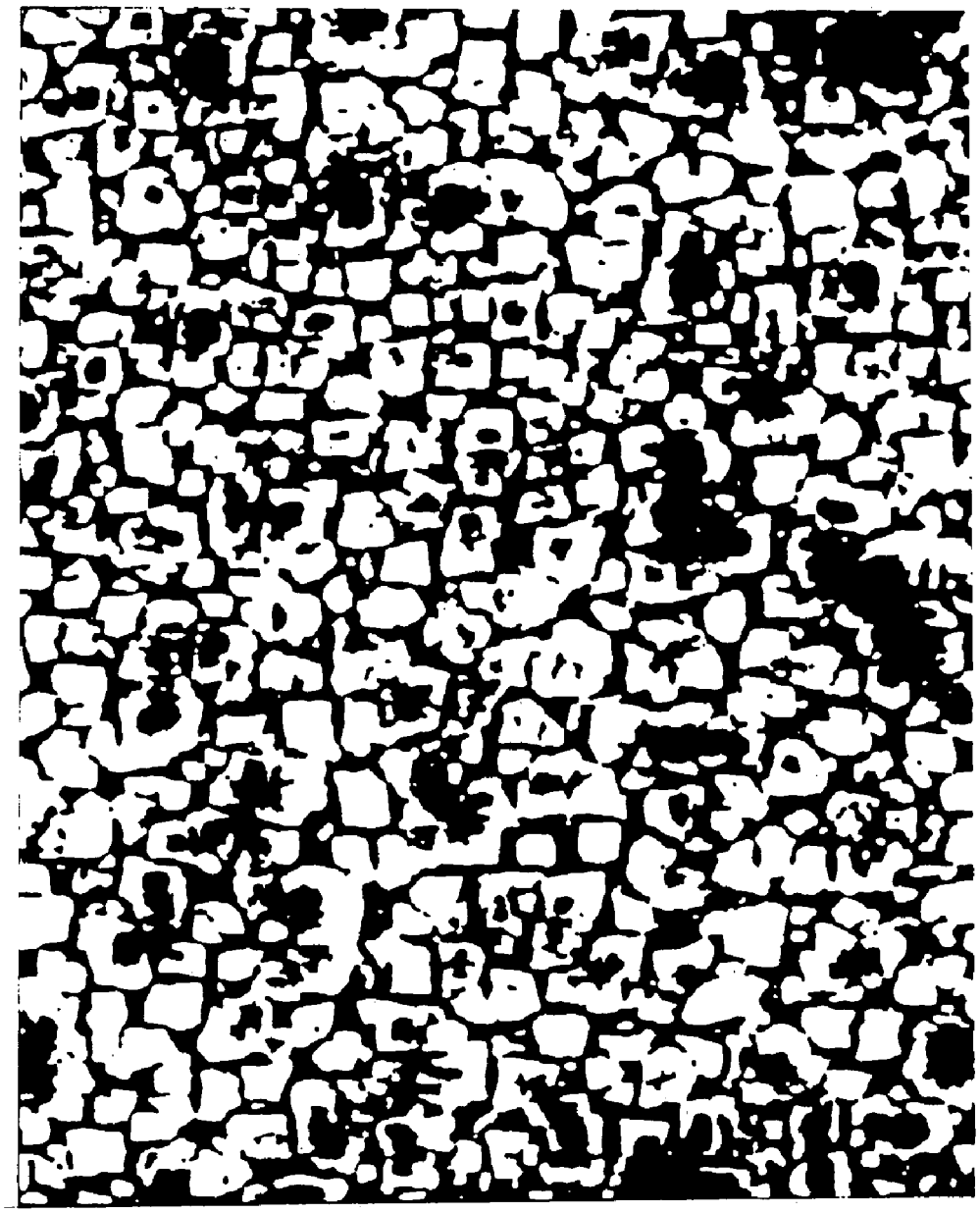
Figure 8:
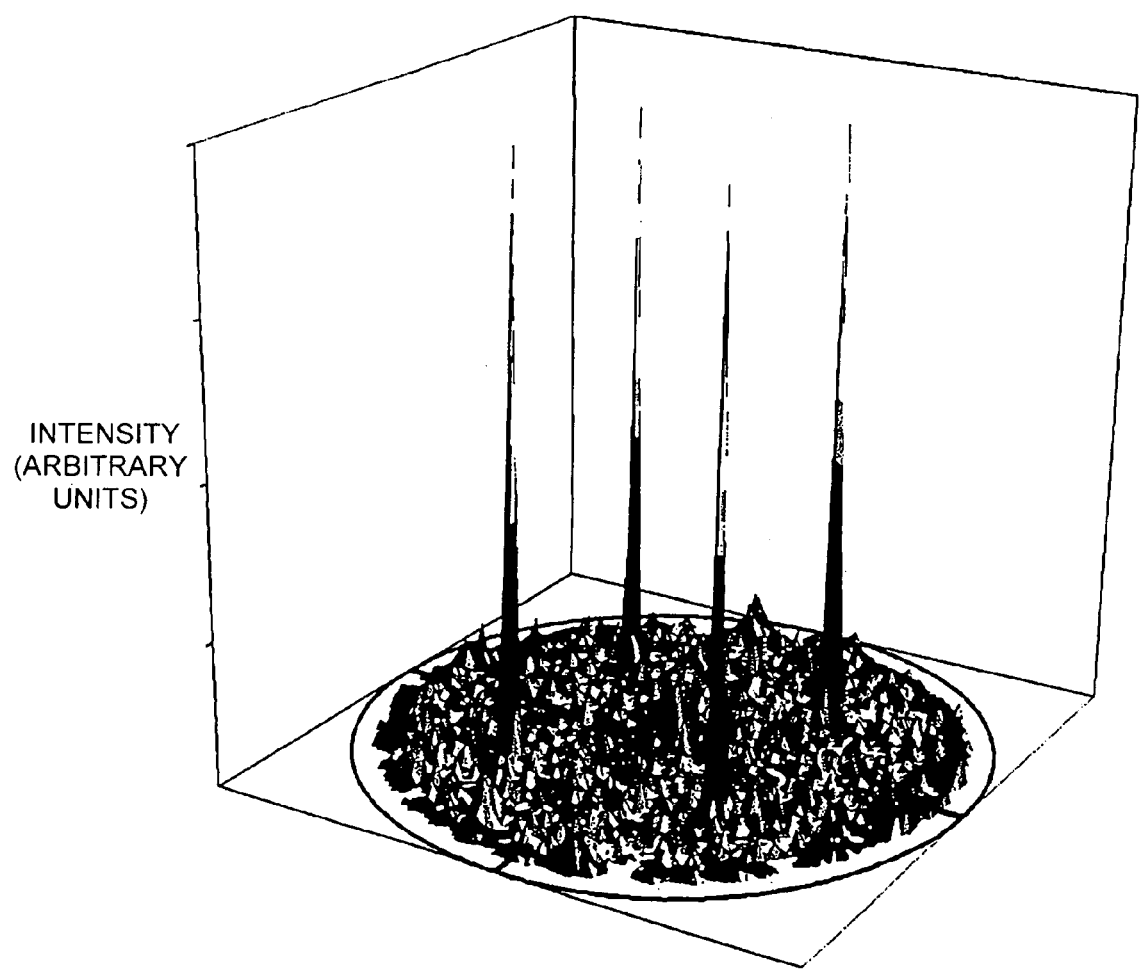
Figure 9A:
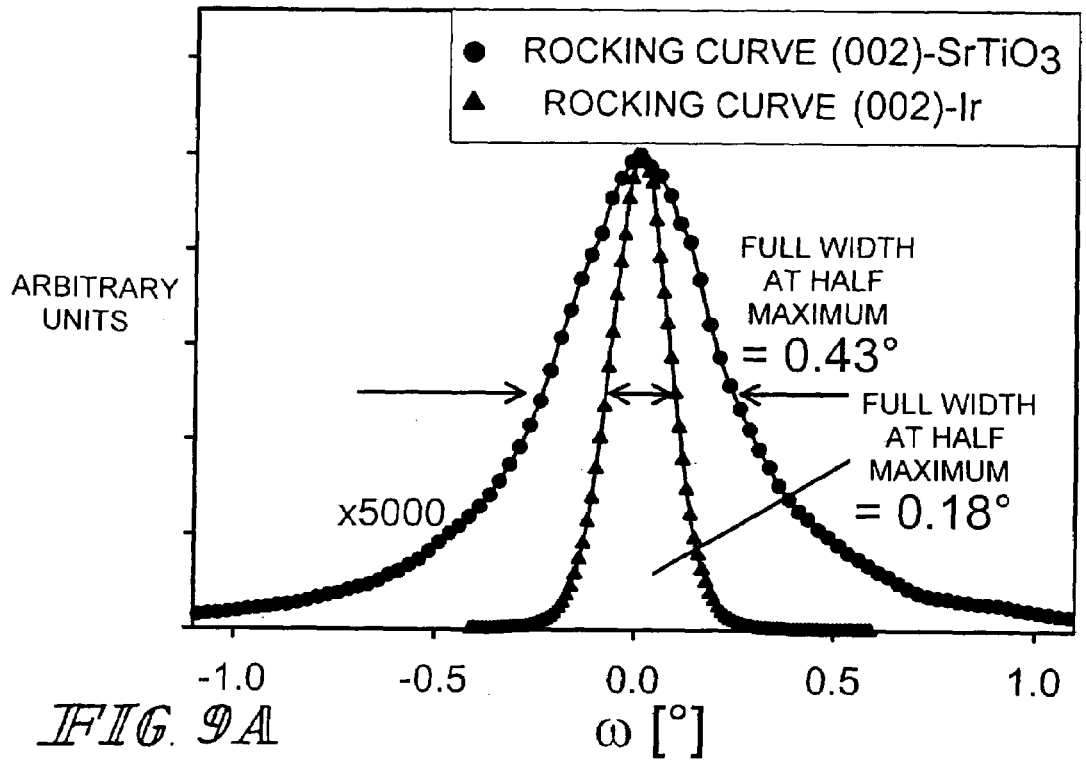
Figure 9B:
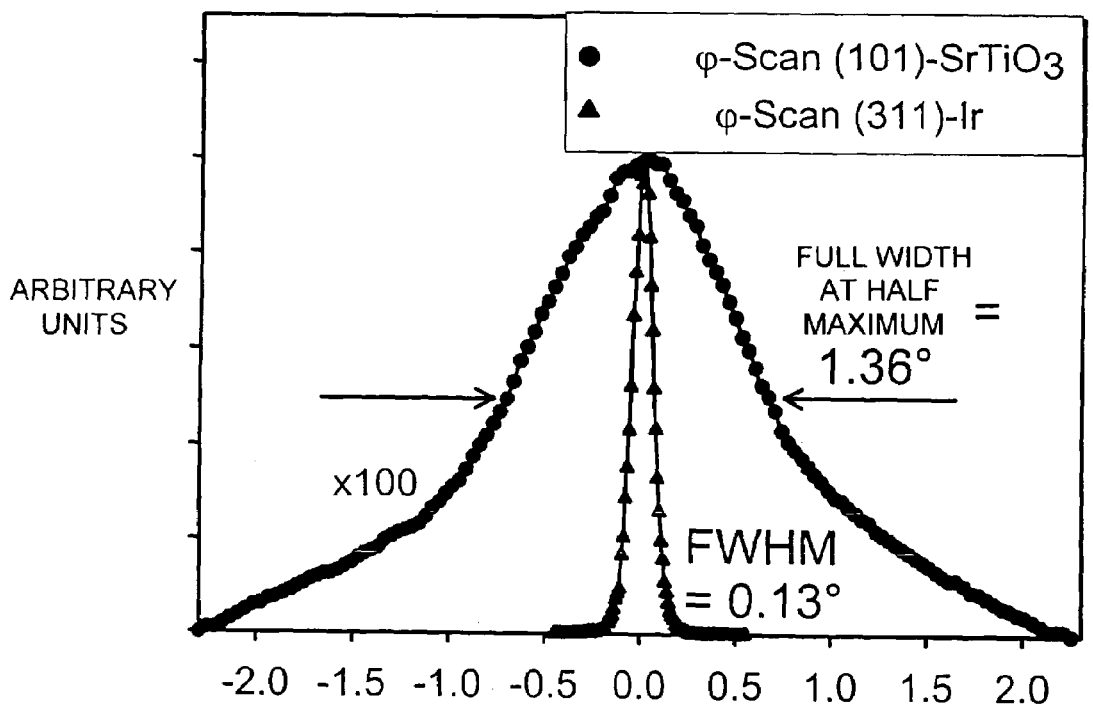
Figure 10:
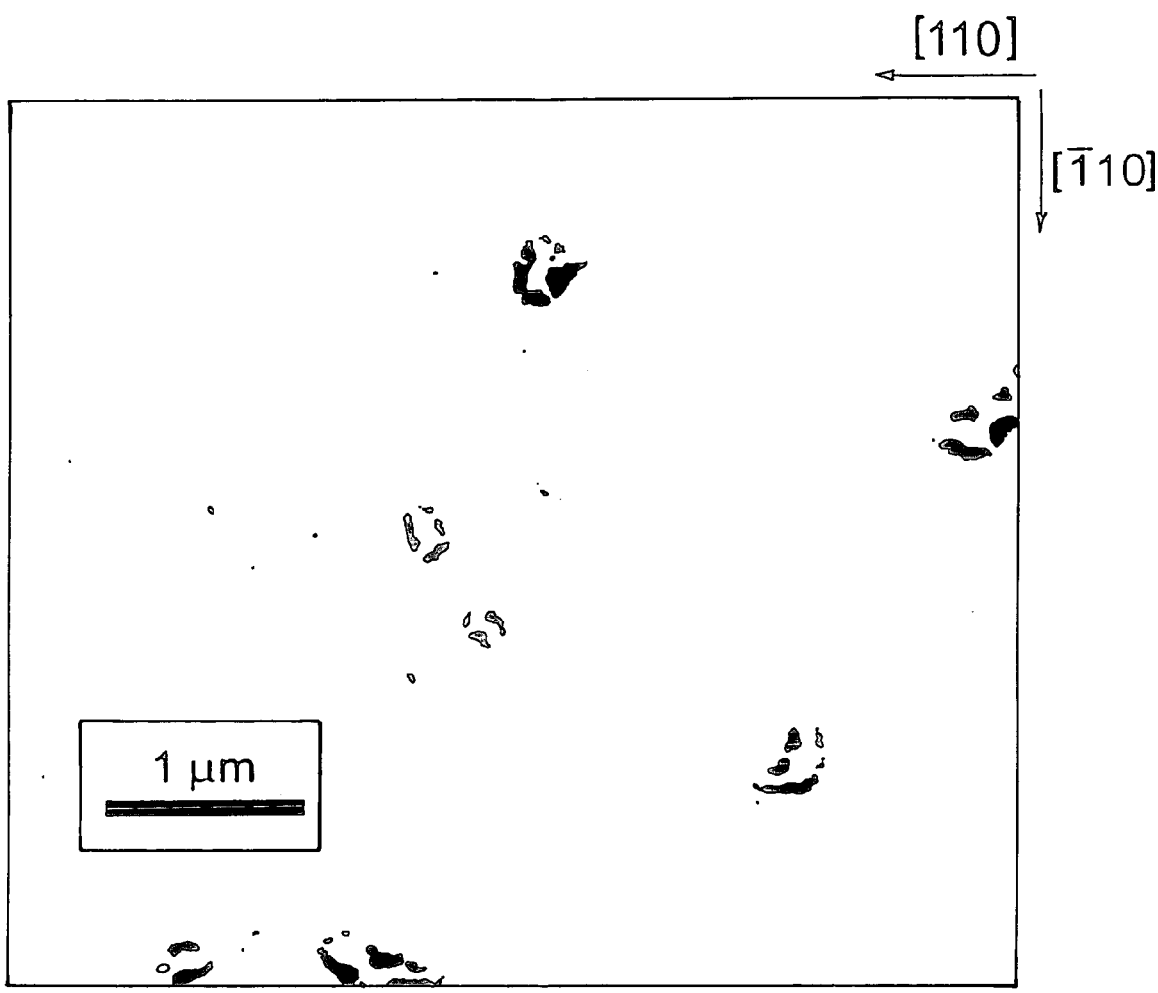
FIG. 10 shows a REM image of the surfaces of this diamond film. A perfect coalescence of the (001) facets can be seen here.
Figure 11A:
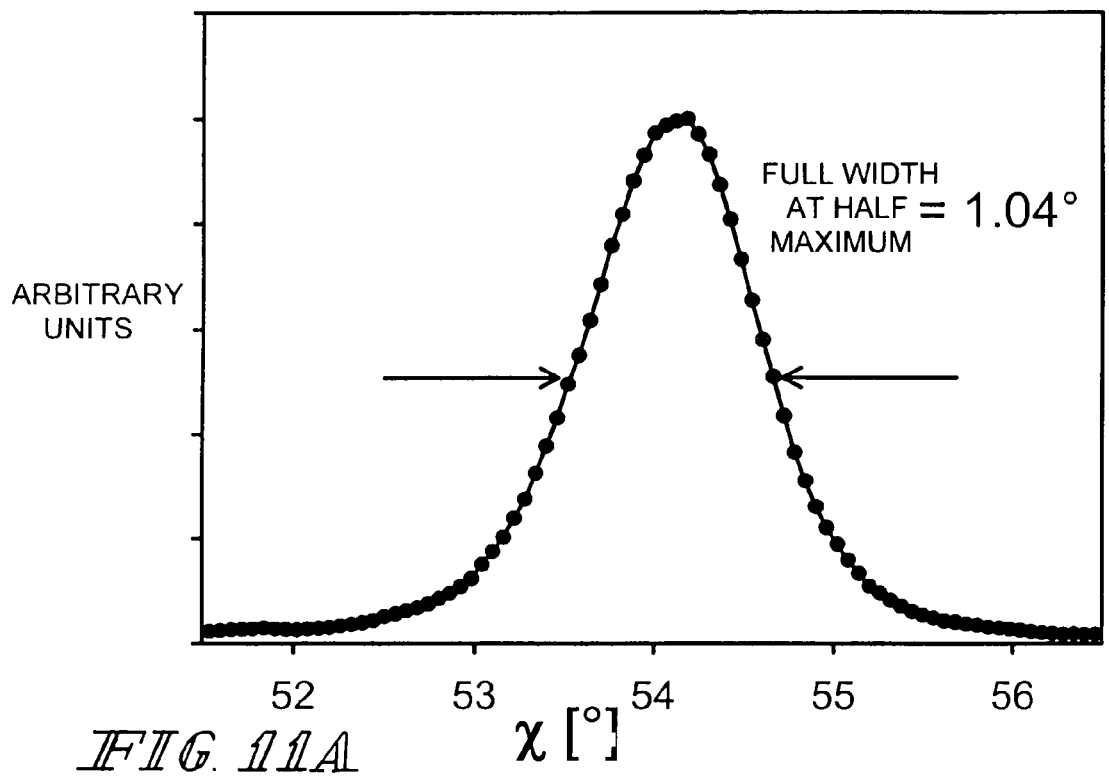
FIG. 11A shows the CHI scan of the diamond (111) reflex on the film from FIG. 10.
Figure 11B:
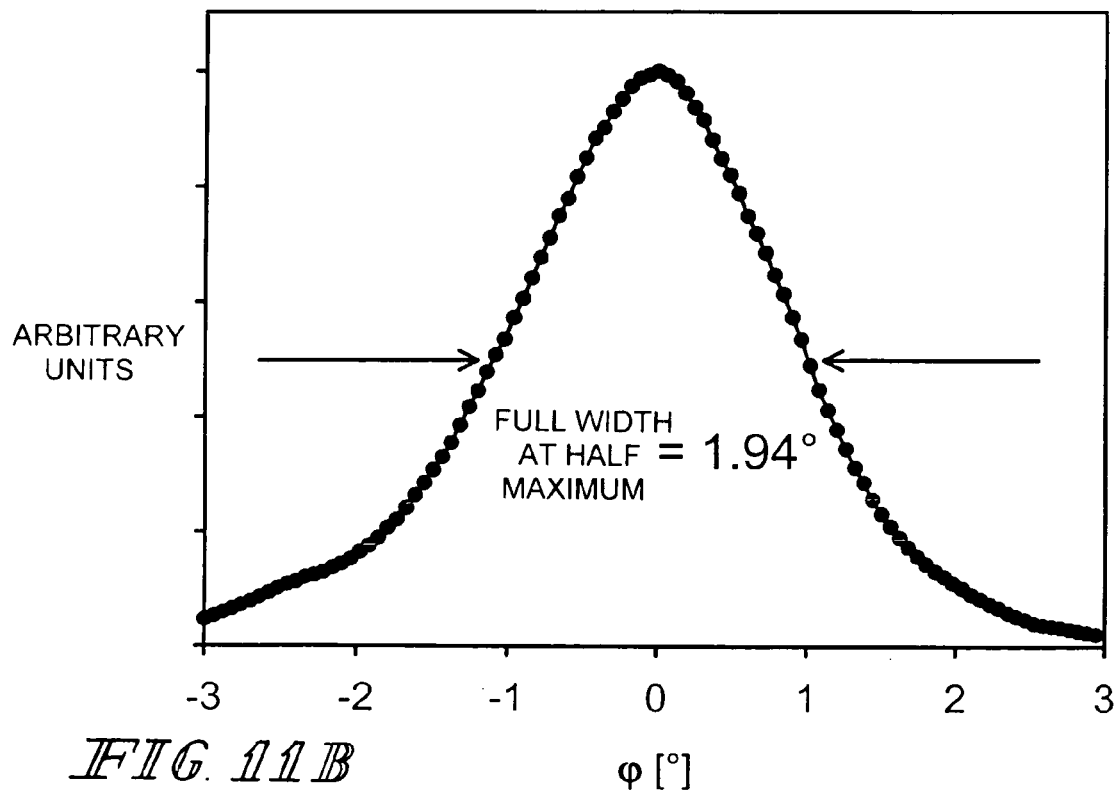
FIG. 11B shows the azimuthal scan of the diamond (111) reflex at 2 theta=43.93° and a polar angle chi=54.73°.
Figure 12A:
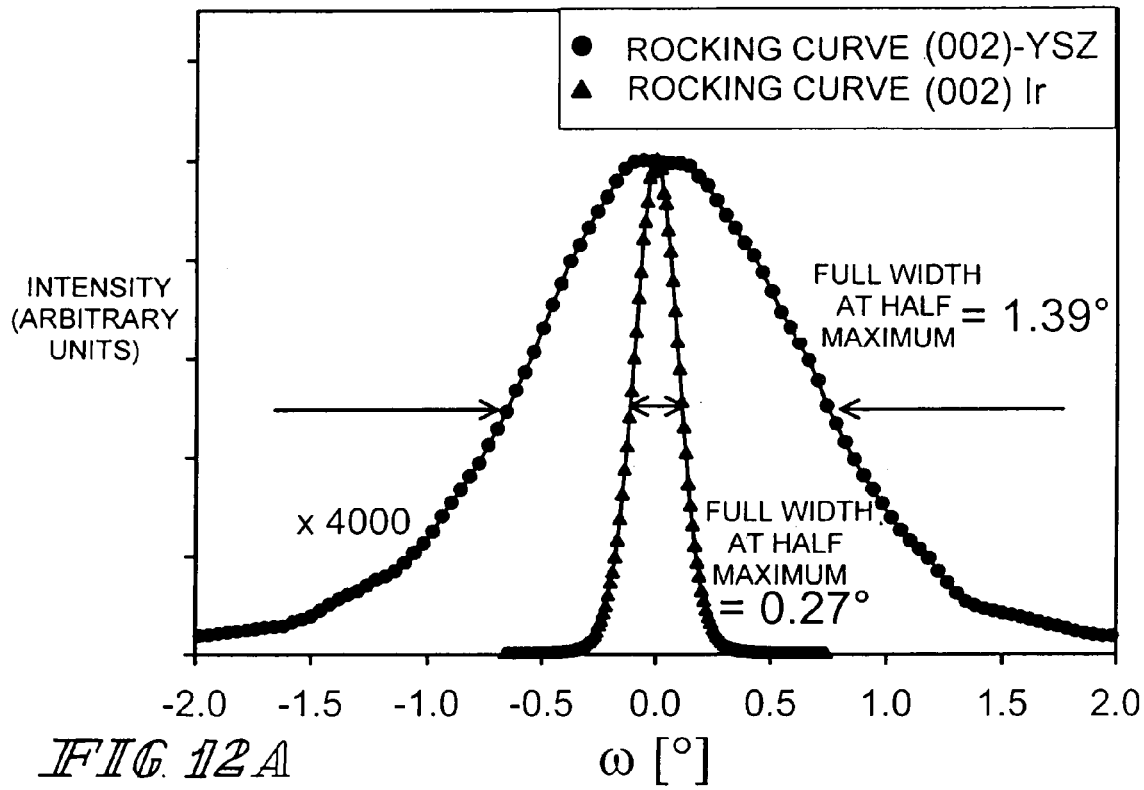
Figure 12B:
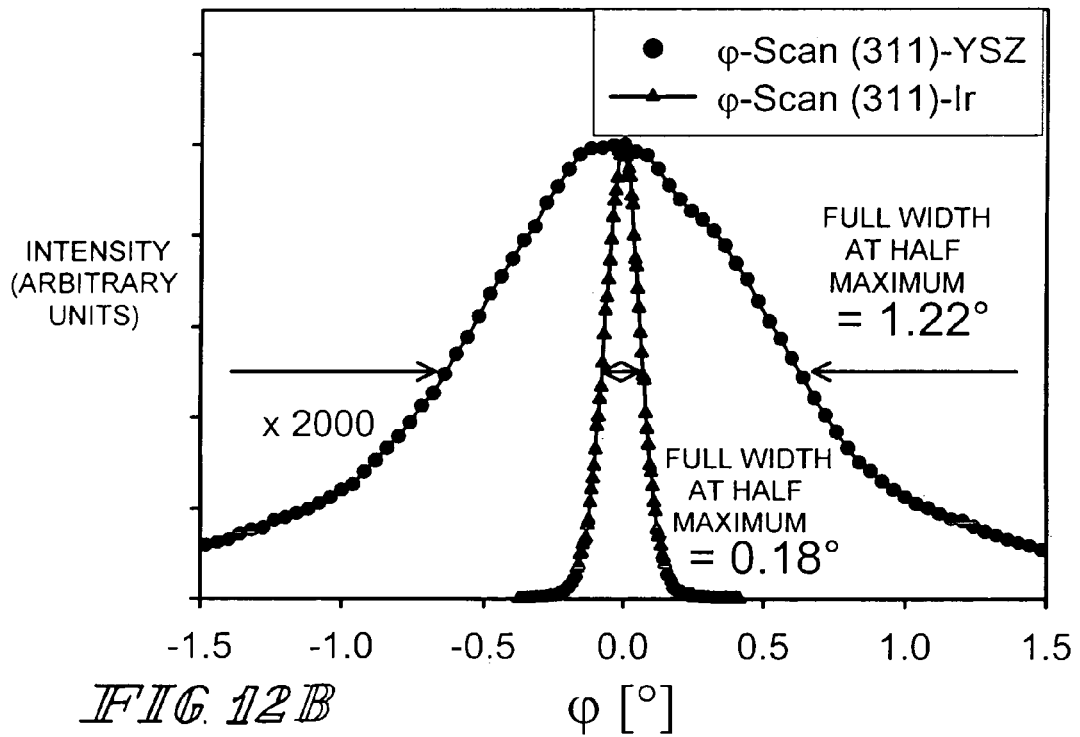

FIG. 12 shows the associated x-ray data for both the YSZ film and the iridium film.

A diamond film as in Example 2 was then deposited onto this iridium film.

EXAMPLE 4

In another example (FIG. 13), a 1.5 nm thick epitaxial yttrium-stabilized zirconium oxide film was applied on silicon (001) as in Example 3. A 50 nm thick cerium oxide film was applied to this using identical laser parameters and a growth rate of 0.016 nm per pulse.

Figure 13A:
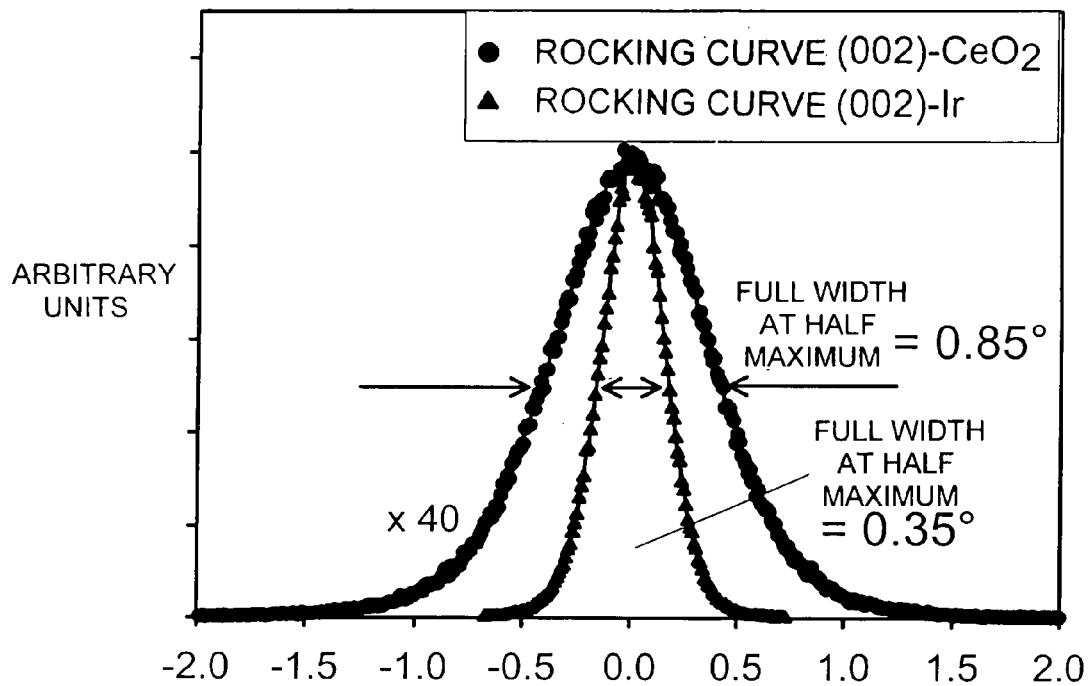
Figure 13B:
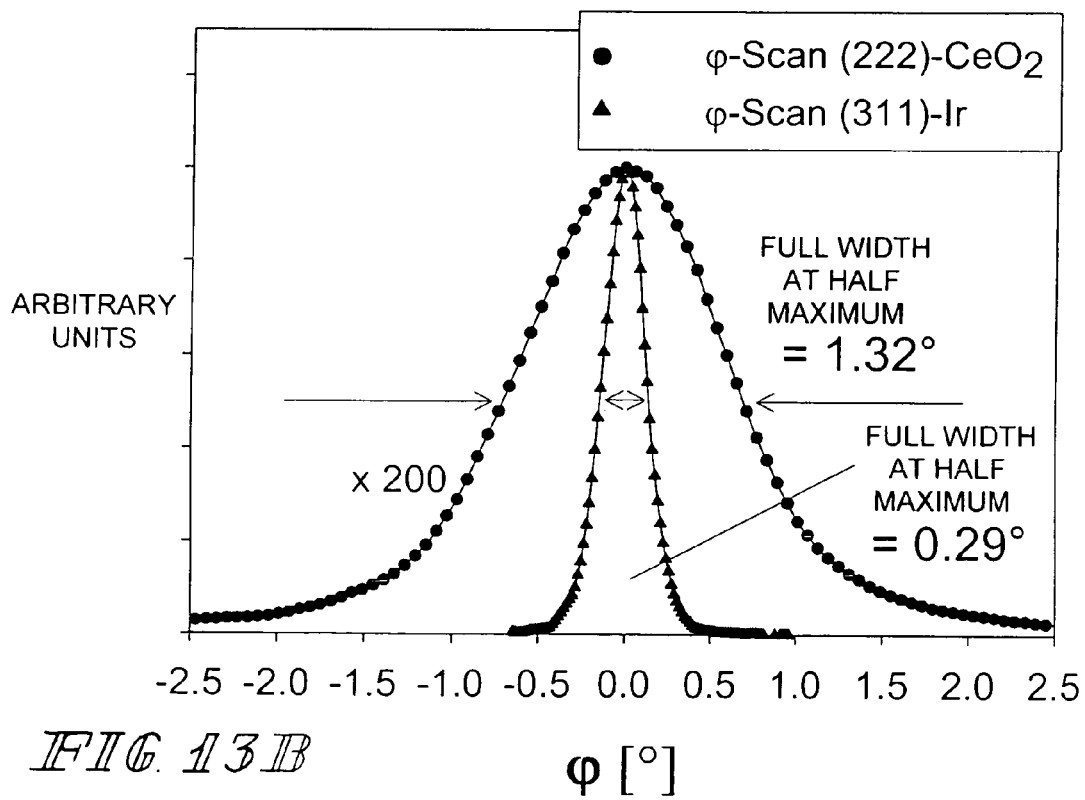

In the x-ray measurements, the orientation of the cerium oxide film resulted in a tilt of 0.85° and a twist of 1.32° (see FIG. 13). An iridium film was now applied to this cerium oxide buffer film as in Example 3, and exhibited a tilt and twist of 0.35° and 0.29° respectively (see x-ray data in FIG. 13).

EXAMPLE 5

In another example, an yttrium-stabilized zirconium oxide film and a cerium oxide film were applied to a silicon (001) substrate as in Example 4. An additional 50 nm thick strontium titanate film was applied to the cerium oxide film using identical laser parameters and a growth rate of 0.016 nm per pulse.

Figure 14A:
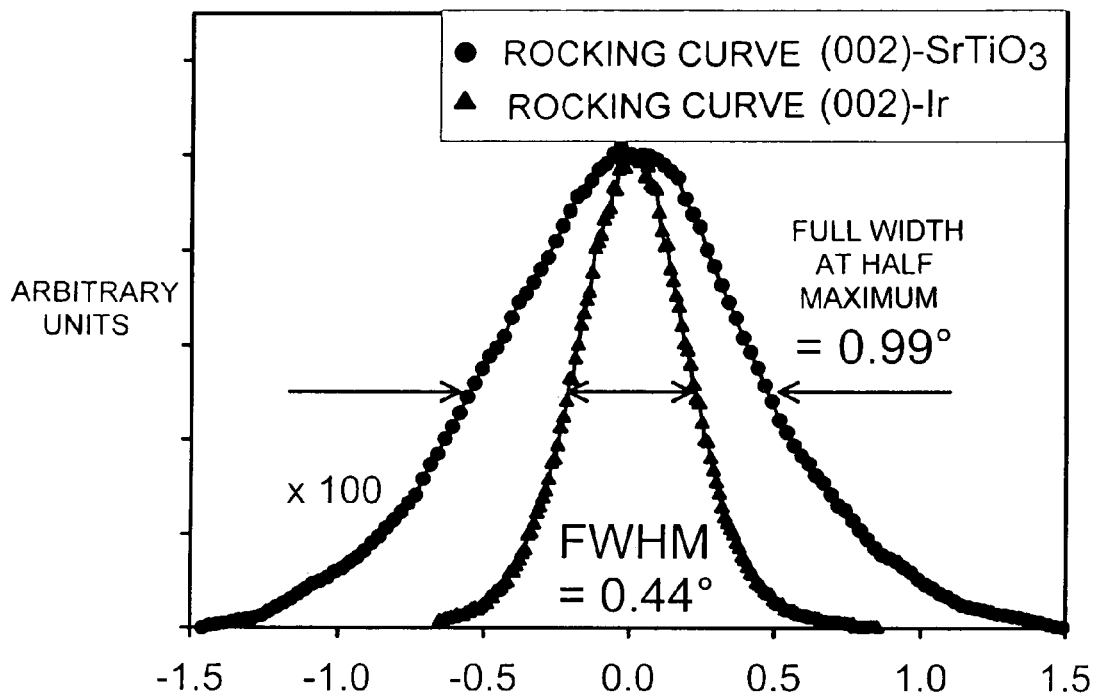
Figure 14B:
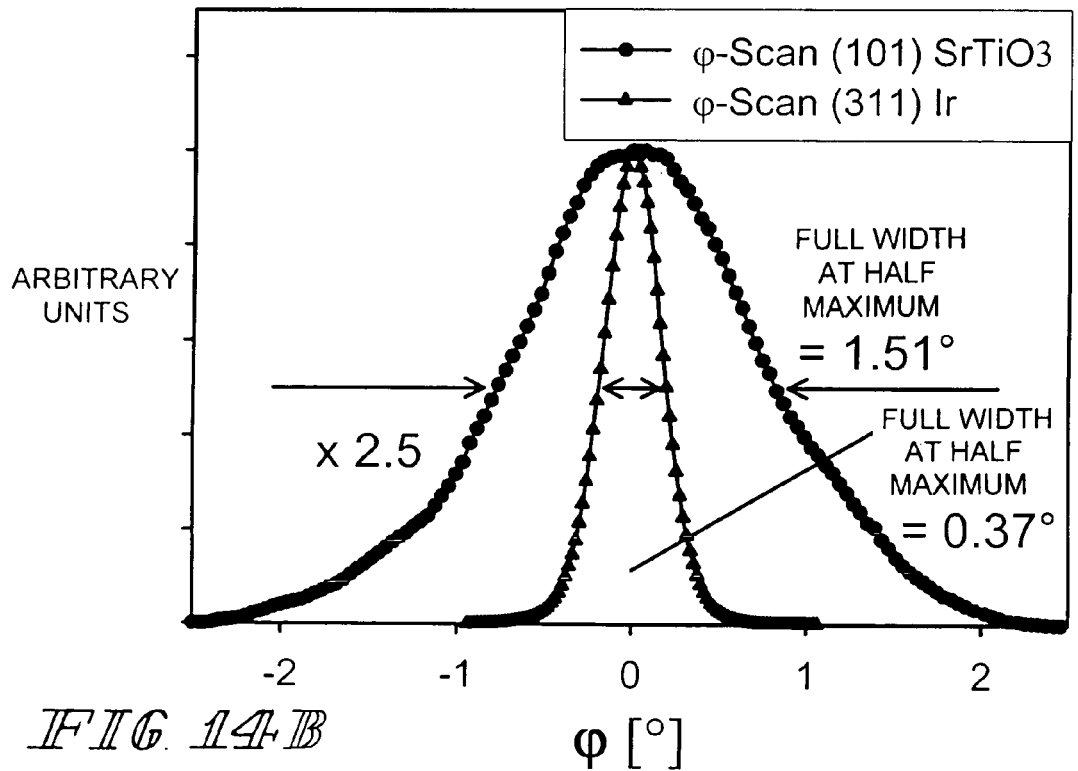

An iridium film followed onto this strontium titanate film as in Example 4. FIG. 14 now shows the x-ray data of the strontium titanate film and the iridium film, whereby the values of 0.99° and 1.51° resulted as tilt and twist of the strontium titanate film, and 0.44° and 0.37° as tilt and twist for the iridium film values.

EXAMPLE 6

In another example, a 50 nm thick epitaxial yttrium-stabilized zirconium oxide film was applied to silicon (111) under growth conditions as in the previous example. An iridium film now follows onto this YSZ film as in the previous example.

Figure 15A:
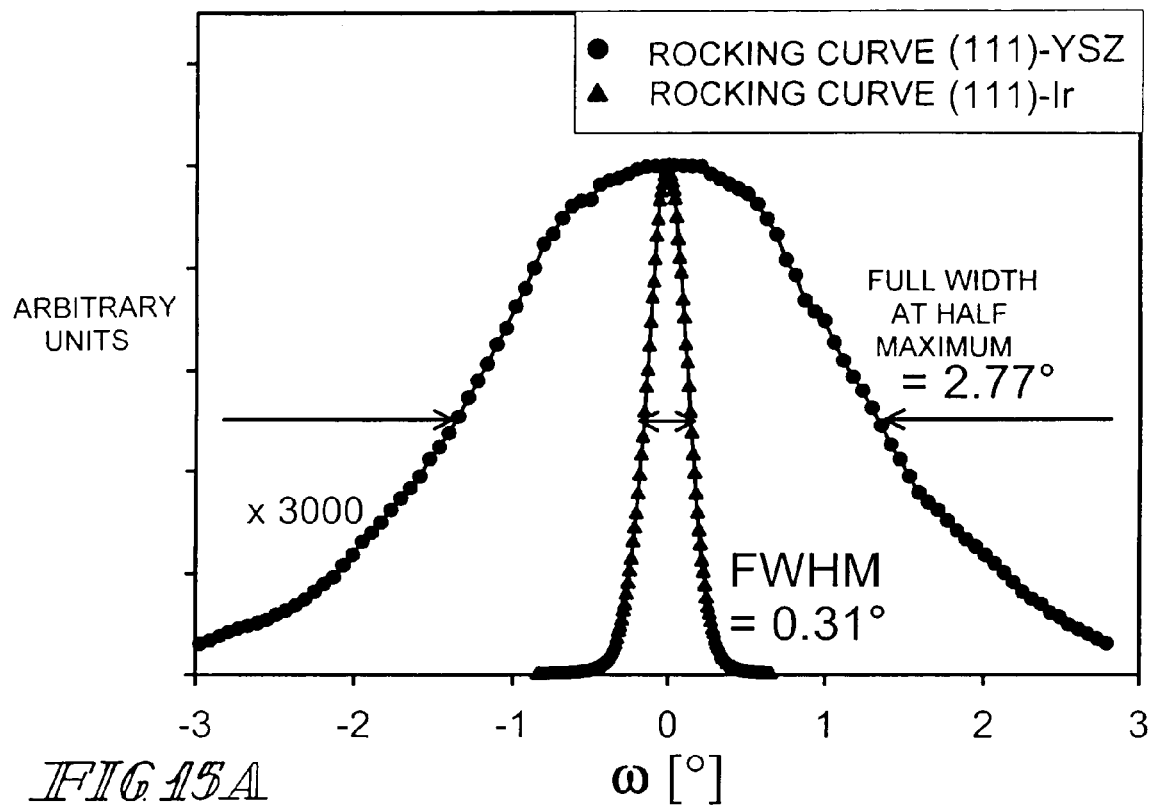
Figure 15B:
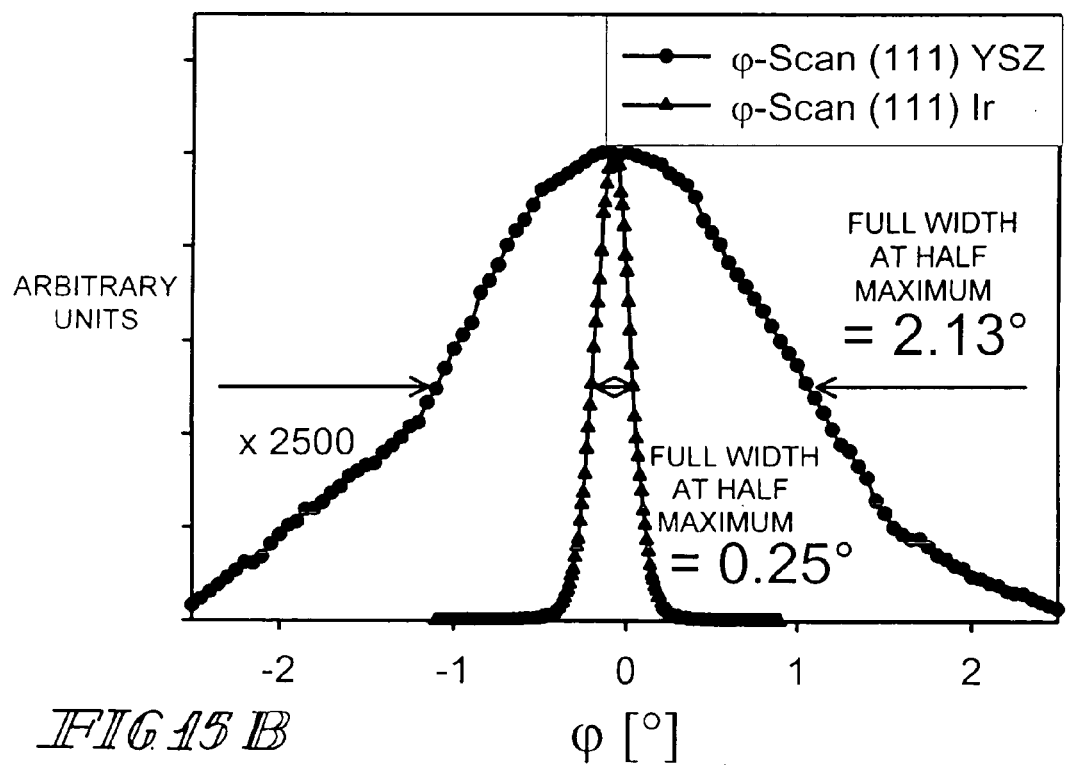

FIG. 15 shows the x-ray data for the YSZ film and the iridium film. Tilt and twist values of 2.77° and 2.13° resulted for the YSZ film and 0.31° and 0.25° for the tilt and twist of the iridium film.

Figure 16:
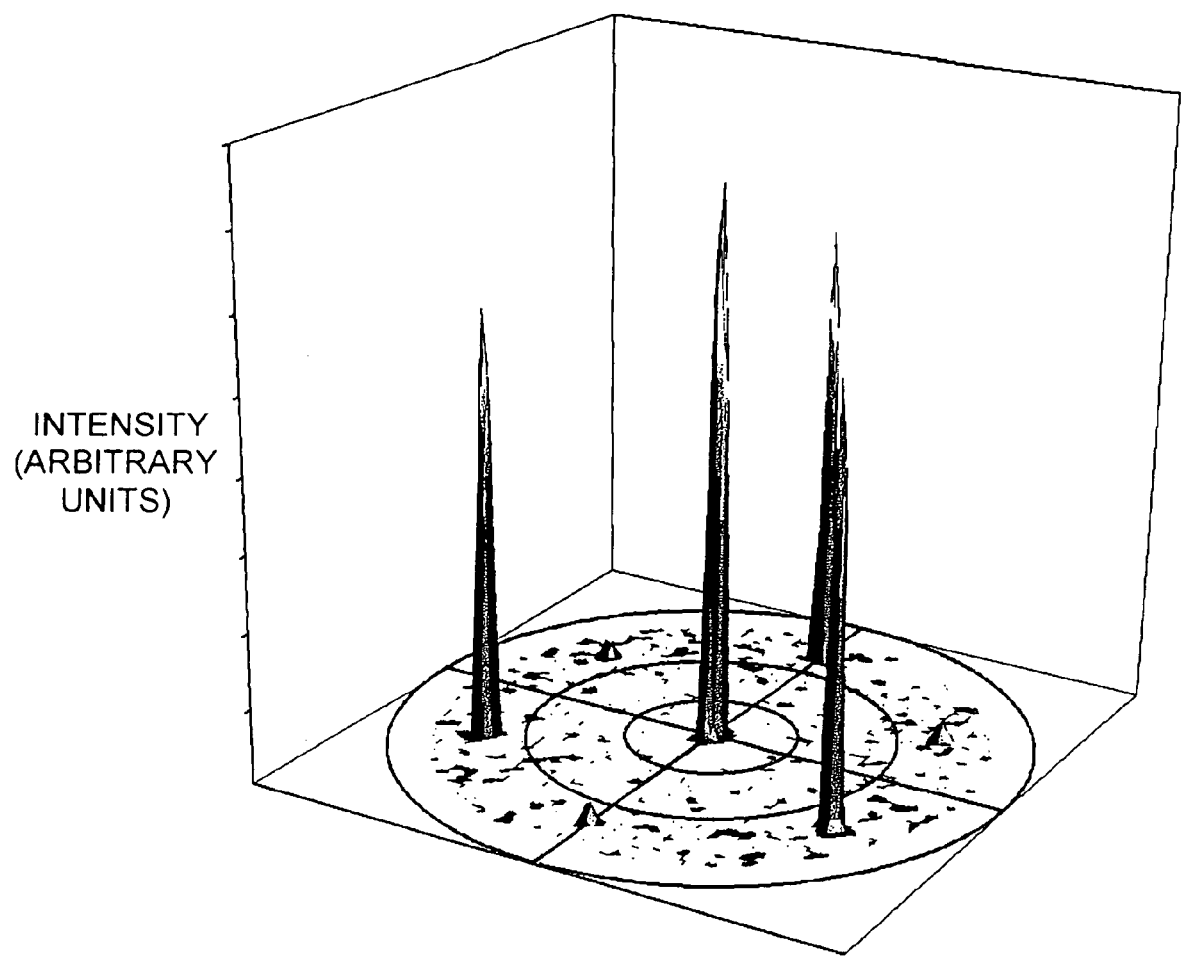

This example in particular shows that outstanding epitaxial iridium films with 111 orientation can even be deposited onto buffer films of relatively high mosaicity on silicon (111). Thus, the deposition of 111-oriented diamond films is also possible. FIG. 16 shows the pole figure of an iridium film that was produced in this way.

EXAMPLE 7

In another example, a 20 nm thick epitaxial strontium titanate (001) film was deposited onto silicon (001) with tilt and twist values of 0.4° and 1.4° respectively. An iridium film was deposited by means of an electron beam vaporizer in a high vacuum as in the previous example. However, the growth rate for the first 25 nm was 0.025 nm/s, and thus more than 12 times what it was in the previous examples.

Tilt and twist of 0.27 and 0.39° were found for the iridium film.

This example shows that the growth rate for iridium in the first sub-step can be varied over a large range without having to accept a substantial worsening of the texture of the iridium film.

The invention claimed is:

1. Diamond film arranged on a body containing a substrate containing at least one of silicon and silicon carbide, at least one buffer film and at least one metal film made of iridium, whereby the diamond film is deposited on the at least one metal film.

2. The diamond film according to claim 1 wherein the at least one buffer film exhibits a thickness between 1 and 2000 nm.

3. The diamond film according to claim 1 wherein the at least one metal film exhibits a thickness between 10 and 1000 nm.

4. The diamond film according to claim 1 wherein the buffer film exhibits a misorientation >2° with regard to at least one of tilt and twist.

5. The diamond film according to claim 1 wherein the diamond film exhibits a misorientation <2° in tilt and twist.

6. A method for the production of diamond films with little misorientation through deposition of diamond on a film system wherein the film system exhibits a substrate film comprising at least one of monocrystalline silicon and silicon carbide, at least one buffer film arranged on that, at least one metal film made of iridium arranged on that, and diamond deposited on the at least one metal film.

7. The method according to claim 6 wherein a monocrystalline silicon intermediate film is arranged between the substrate and the buffer film.

8. The method according to claim 6 in which several sequences, each comprising at least one buffer film and one metal film made of a refractory metal, are arranged between the substrate and the diamond film.

9. The method according to claim 6 wherein the at least one buffer film contains at least one of an oxidic buffer film, silicon carbide (SiC), titanium nitride (TiN), strontium titanate ($SrTiO_3$), barium titanate ($BaTiO_3$), titanium oxide ($TiO_2$), aluminum oxide ($Al_2O_3$), yttrium-stabilized zirconium oxide (YSZ), $Y_2O_3$, MgO and cerium oxide ($CeO_2$).

10. The method according to claim 6 wherein the films are deposited on the substrate by at least one of a vacuum method, PVD, CVD, laser ablation (PLD), sputtering, and MBE.

11. The method according to claim 6 wherein the at least one buffer film exhibits a thickness between 1 and 2000 nm.

12. The method according to claim 6 wherein the at least one metal film exhibits a thickness between 10 and 1000 nm.

13. The method according to claim 6 wherein the buffer film exhibits a misorientation >2° with regard to at least one of tilt and twist.

14. The method according to claim 6 wherein the metal film is deposited at a deposition rate <0.4 nm/min at least until the metal film exhibits a closed surface.

15. The method according to claim 6 further comprising removing at least one of individual films, the entire film system and the diamond film on the side facing the substrate by at least one of etching and polishing at least in parts of the diamond film.

16. A method for producing a component in one of mechanics, micromechanics, electronics, microelectronics, optics, and surgery, the method comprising deposition of diamond on a film system wherein the film system exhibits a substrate film comprising at least one of monocrystalline silicon and silicon carbide, at least one buffer film arranged on that, at least one metal film made of iridium arranged on that, and diamond deposited on the at least one metal film.

17. A method for producing at least one of a cutting edge, a scalpel, a growth substrate for the epitaxial growth of at least one of semiconductor material and ferromagnetic material, a template for the production of diamond films with low misorientation, and a template for monocrystalline diamond film, the method comprising deposition of diamond on a film system wherein the film system exhibits a substrate film comprising at least one of monocrystalline silicon and silicon carbide, at least one buffer film arranged on that, at least one metal film made of iridium arranged on that, and diamond deposited on the at least one metal film.

18. A method for producing at least one of a break-resistant laser window, a break-resistant window for a gyrotron, a break-resistant x-ray window, a break-resistant membrane for x-ray lithography, and a high-performance electronic component for at least one of high temperatures, high powers, high frequencies, micromechanics, microelectromechanics, diamond cutters, carbide tools for cutters, milling cutters, and drills comprising one of monocrystalline diamond and quasi monocrystalline diamond, the method comprising deposition of diamond on a film system wherein the film system exhibits a substrate film comprising at least one of monocrystalline silicon and silicon carbide, at least one buffer film arranged on that, at least one metal film made of iridium arranged on that, and diamond deposited on the at least one metal film.

19. A method of producing a diamond film with little misorientation, the method comprising depositing diamond on a film system comprising at least one of monocrystalline silicon and silicon carbide, at least one buffer film arranged on the at least one of monocrystalline silicon and silicon carbide, at least one metal film made of iridium arranged on the at least one buffer film, and diamond deposited on the at least one metal film made of iridium.

* * * * *